US008896304B2

(12) United States Patent  (10) Patent No.: US 8,896,304 B2
Suto  (45) Date of Patent: Nov. 25, 2014

(54) MAGNETIC SENSOR

(71) Applicant: TDK Corporation, Tokyo (JP)

(72) Inventor: Toshihide Suto, Tokyo (JP)

(73) Assignee: TDK Corporation, Tokyo (JP)

( * ) Notice: Subject to any disclaimer, the term of this patent is extended or adjusted under 35 U.S.C. 154(b) by 137 days.

(21) Appl. No.: 13/777,666

(22) Filed: Feb. 26, 2013

(65) Prior Publication Data

US 2014/0009145 A1   Jan. 9, 2014

(30) Foreign Application Priority Data

Jul. 5, 2012   (JP) .................................. 2012-151694

(51) Int. Cl.
*G01R 31/02* (2006.01)
*G01R 33/09* (2006.01)
(52) U.S. Cl.
CPC .................................... *G01R 33/093* (2013.01)
USPC ....... 324/252; 324/207.21; 257/421; 360/319
(58) Field of Classification Search
USPC .................................... 324/252, 207.21, 249
See application file for complete search history.

(56) References Cited

U.S. PATENT DOCUMENTS 7,355,884 B2 *  4/2008  Nakayama et al. ........... 365/158
7,518,907 B2 *  4/2009  Nakayama et al. ........... 365/158
7,876,534 B2 *  1/2011  Chou et al. .................... 360/319
7,998,758 B2    8/2011  Ahn et al.
8,009,465 B2 *  8/2011  Nakayama et al. ........... 365/158
8,014,108 B2 *  9/2011  Shimazawa et al. .......... 360/319
2011/0025320 A1  2/2011  Ohta et al.

FOREIGN PATENT DOCUMENTS

JP    A-2008-157844    7/2008

OTHER PUBLICATIONS

Kou et al., "Development of Highly Sensitive Terrestrial Sensor using TMR Junctions," Journal of the Magnetics Society of Japan, vol. 32, No. 3, 2008, pp. 361-365 (with English Abstract).

* cited by examiner

*Primary Examiner* — Tung X Nguyen
*Assistant Examiner* — Alesa Allgood
(74) *Attorney, Agent, or Firm* — Oliff PLC

(57) ABSTRACT

A magnetic sensor includes first and second MR elements, and an electrode electrically connecting the first and second MR elements to each other. The electrode includes a first portion having a first surface, a second portion having a second surface, and a coupling portion coupling the first and second portions to each other. The first surface is in contact with an end face of the first MR element. The second surface is in contact with an end face of the second MR element. Each of the first and second surfaces has a three-hold or higher rotationally symmetric shape. The diameter of a first inscribed circle inscribed in the outer edge of the first surface and the diameter of the second inscribed circle inscribed in the outer edge of the second surface are greater than the width of the coupling portion.

8 Claims, 13 Drawing Sheets

MAGNETIC SENSOR

BACKGROUND OF THE INVENTION

1. Field of the Invention

The present invention relates to a magnetic sensor for use to detect the direction of an external magnetic field.

2. Description of the Related Art

In recent years, magnetic sensors have been widely used to detect the rotational position of an object in various applications such as detecting the rotational position of an automotive steering wheel. Linear encoders for detecting a linear displacement of an object also use magnetic sensors. Such systems using magnetic sensors are typically provided with means (for example, a magnet) for generating an external magnetic field whose direction rotates in conjunction with the rotation or linear movement of the object. Magnetic sensors detect the angle that the direction of the external magnetic field in a reference position forms with respect to a reference direction. The rotational position or linear displacement of the object is thus detected.

Among known magnetic sensors is one that employs a spin-valve magnetoresistive (MR) element, as disclosed in U.S. Patent Application Publication No. 2011/0025320 A1 and JP 2008-157844 A. The spin-valve MR element includes a first ferromagnetic layer, a nonmagnetic layer, and a second ferromagnetic layer stacked in this order. One of the first and second ferromagnetic layers is a magnetization pinned layer whose magnetization direction is pinned, and the other is a free layer whose magnetization direction varies according to the direction of an external magnetic field.

Further, also known as a magnetic sensor is one that includes a plurality of MR elements of current-perpendicular-to-plane (CPP) type connected in series, as disclosed in U.S. Patent Application Publication No. 2011/0025320 A1. A plurality of MR films (in a stack) disclosed in this U.S. publication correspond to the plurality of MR elements of CPP type mentioned above. An MR element of CPP type is such that a current for use in magnetic signal detection is fed in a direction generally perpendicular to the planes of layers constituting the MR element.

To connect a plurality of MR elements of CPP type in series, it is necessary to provide an electrode for electrical connection between respective end faces of two adjacent MR elements. The electrode is typically shaped to be constant in width and elongated in one direction so as to be placed across the two MR elements.

U.S. Pat. No. 7,998,758 B2 and Kou et al., "Development of Highly Sensitive Terrestrial Sensor using TMR Junctions", Journal of the Magnetics Society of Japan, Vol. 32, No. 3, pp. 361-365 (2008) each disclose an electrode that is in contact with an end face of an MR element. The electrode has a narrow portion elongated in one direction, and two wide portions greater in width than the narrow portion and coupled to opposite ends of the narrow portion in the longitudinal direction. The electrode is configured so that a portion located at the longitudinal center of the narrow portion is in contact with the end face of the MR element.

Studies conducted by the inventors of this application have shown that a magnetic sensor including a plurality of serially connected MR elements of CPP type may have the following problem if the electrode in contact with the end faces of the MR elements is shaped to be constant in width and elongated in one direction. When expansion or contraction of the electrode or the material therearound occurs due to, for example, a change in temperature around the magnetic sensor, stress will be produced in the electrode, and this will in turn induce stress in the MR elements in contact with the electrode. Here, if the electrode is shaped to be constant in width and elongated in one direction, the stress induced in the MR elements by the electrode has anisotropy such that the magnitude of the stress varies according to direction. In this case, if the first and second ferromagnetic layers of the MR elements have a non-zero magnetostriction constant, the first and second ferromagnetic layers will have a stress magnetic anisotropy. The stress magnetic anisotropy may cause degradation in the detection accuracy of the magnetic sensor.

OBJECT AND SUMMARY OF THE INVENTION

It is an object of the present invention to provide a magnetic sensor for use to detect the direction of an external magnetic field, the magnetic sensor being capable of preventing degradation in the detection accuracy attributable to an electrode in contact with end faces of magnetoresistive elements.

A magnetic sensor of the present invention includes first and second magnetoresistive elements, and an electrode electrically connecting the first and second magnetoresistive elements to each other. Each of the first and second magnetoresistive elements has a first end face and a second end face opposite to each other in a first direction, and includes a first ferromagnetic layer, a nonmagnetic layer, and a second ferromagnetic layer stacked along the first direction between the first end face and the second end face. The first and second magnetoresistive elements are aligned in a second direction orthogonal to the first direction. The electrode includes a first portion having a first surface, a second portion having a second surface, and a coupling portion coupling the first and second portions to each other. At least part of the first surface is in contact with the first end face of the first magnetoresistive element, and at least part of the second surface is in contact with the first end face of the second magnetoresistive element. Each of the first and second surfaces has a three-hold or higher rotationally symmetric shape. Each of a first inscribed circle inscribed in the outer edge of the first surface and a second inscribed circle inscribed in the outer edge of the second surface has a diameter greater than the width of the coupling portion in a third direction orthogonal to the first and second directions.

In the magnetic sensor of the present invention, each of the first end face of the first magnetoresistive element and the first end face of the second magnetoresistive element may have a three-hold or higher rotationally symmetric shape. In this case, the center of the first end face of the first magnetoresistive element and the center of the first surface may coincide with each other, while the center of the first end face of the second magnetoresistive element and the center of the second surface may coincide with each other.

In the magnetic sensor of the present invention, each of the first surface and the second surface may have a four-hold or higher rotationally symmetric shape. Further, each of the first surface and the second surface may have a four-hold or higher, even number-hold rotationally symmetric shape. In this case, the ratio of the diameter of the first inscribed circle to the width of the coupling portion and the ratio of the diameter of the second inscribed circle to the width of the coupling portion may fall within the range of 1.5 to 10, or within the range of 1.5 to 5.

In the magnetic sensor of the present invention, one of the first and second ferromagnetic layers may be a magnetization pinned layer whose magnetization direction is pinned, and the other may be a free layer whose magnetization direction varies according to the direction of an external magnetic field.

The electrode of the magnetic sensor of the present invention has the features that each of the first surface and the second surface has a three-fold or higher rotationally symmetric shape, and the diameter of the first inscribed circle inscribed in the outer edge of the first surface and the diameter of the second inscribed circle inscribed in the outer edge of the second surface are greater than the width of the coupling portion in the third direction. These features alleviate the anisotropy of stress induced in magnetoresistive elements by the electrode in contact with the end faces of the magnetoresistive elements. Consequently, according to the present invention, it is possible to prevent degradation in the detection accuracy attributable to the electrode.

Other and further objects, features and advantages of the present invention will appear more fully from the following description.

DETAILED DESCRIPTION OF THE PREFERRED EMBODIMENT

Figure 1:
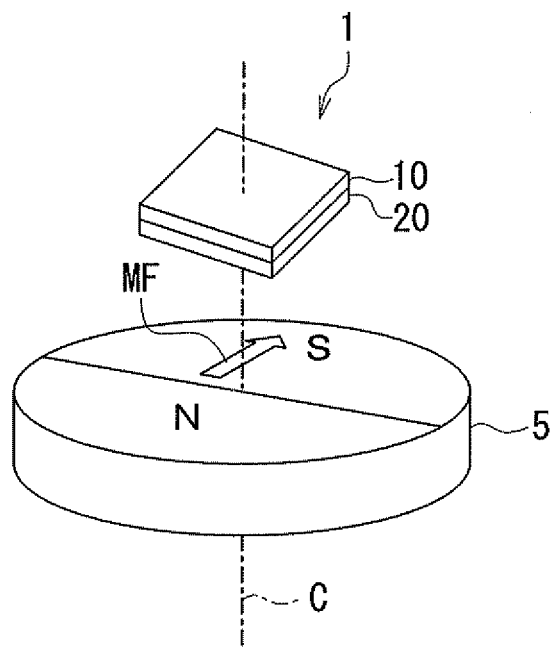
FIG. 1 is a perspective view illustrating the general configuration of a magnetic sensor according to an embodiment of the invention.
Figure 2:
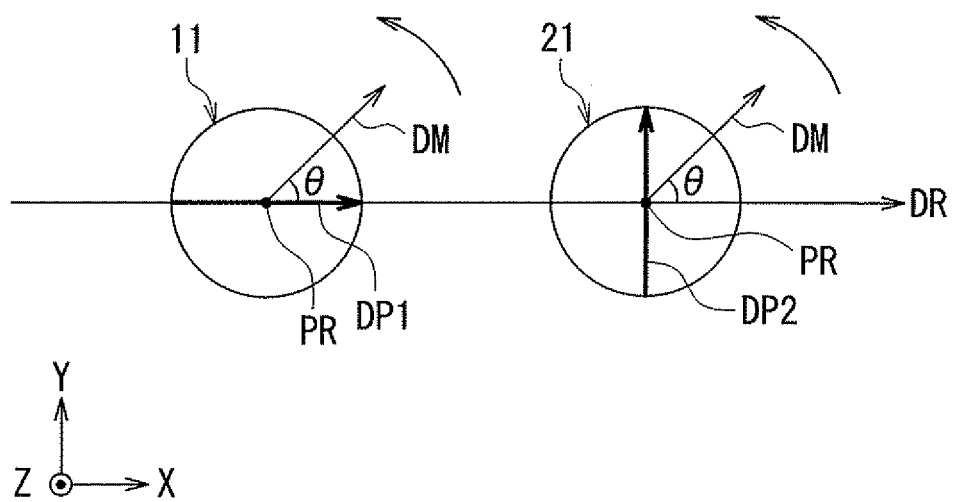
FIG. 2 is an explanatory diagram illustrating the definitions of directions and angles in the embodiment of the invention.
Figure 3:
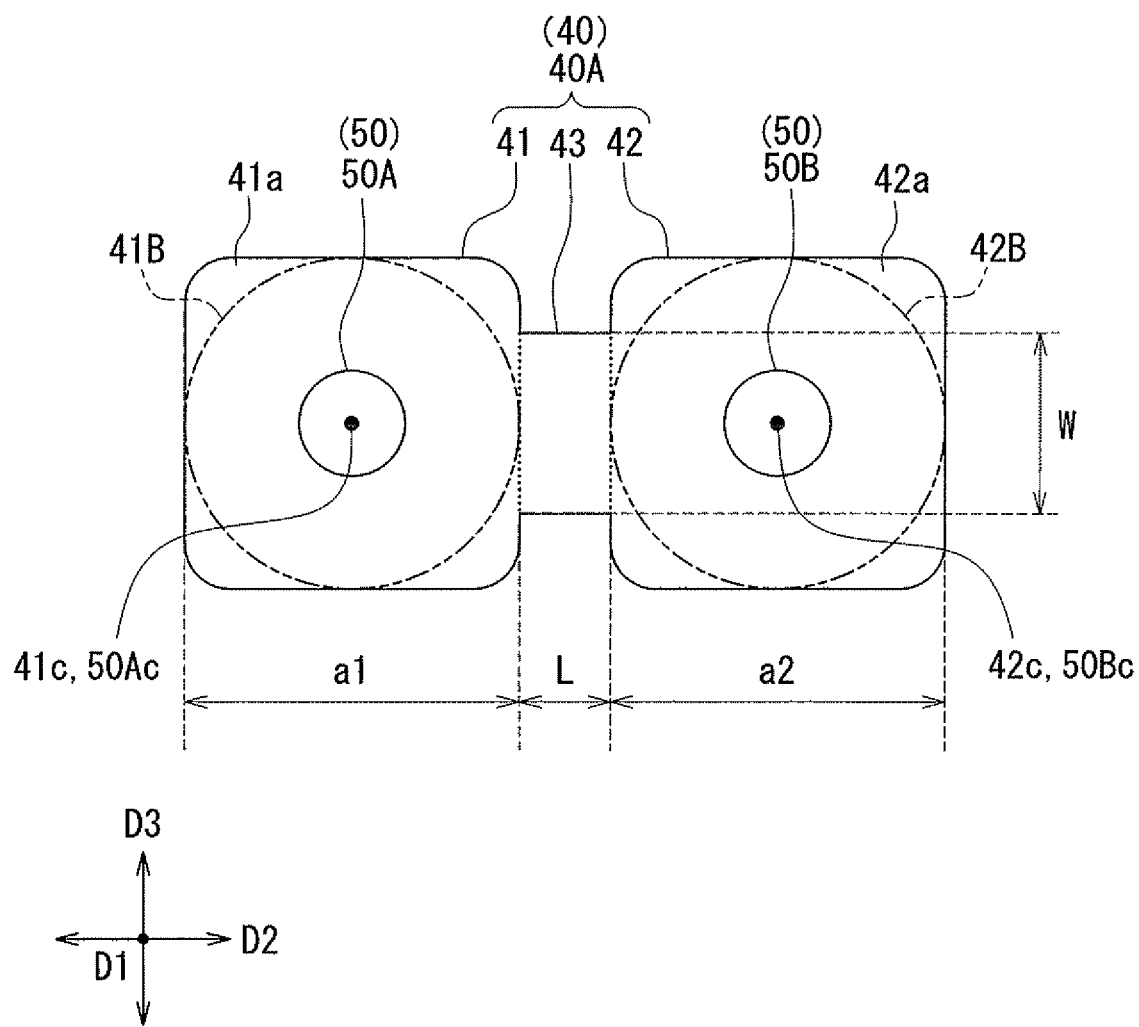
FIG. 3 is a plan view illustrating first and second MR elements and an electrode of the embodiment of the invention.

A preferred embodiment of the present invention will now be described in detail with reference to the drawings. First, reference is made to FIG. 1 to FIG. 3 to describe the general configuration of a magnetic sensor according to the embodiment of the invention. FIG. 1 is a perspective view illustrating the general configuration of the magnetic sensor according to the embodiment. FIG. 2 is an explanatory diagram illustrating the definitions of directions and angles in the embodiment. FIG. 3 is a plan view illustrating first and second MR elements and an electrode connecting them which are included in the magnetic sensor according to the embodiment.

As shown in FIG. 1, the magnetic sensor 1 according to the embodiment detects the angle that the direction of an external magnetic field MF in a reference position forms with respect to a reference direction. The direction of the external magnetic field MF in the reference position rotates when viewed from the magnetic sensor 1. In FIG. 1, a cylindrical magnet 5 is shown as an example of means for generating the external magnetic field MF. The magnet 5 has an N pole and an S pole that are arranged symmetrically with respect to a virtual plane including the central axis of the cylinder. The magnet 5 rotates about the central axis of the cylinder. Consequently, the direction of the external magnetic field MF generated by the magnet 5 rotates about a center of rotation C including the central axis of the cylinder.

The reference position is located within a virtual plane parallel to an end face of the magnet 5. This virtual plane will hereinafter be referred to as the reference plane. In the reference plane, the direction of the external magnetic field MF generated by the magnet 5 rotates about the reference position. The reference direction is located within the reference plane and intersects the reference position. In the following descriptions, the direction of the external magnetic field MF in the reference position refers to a direction that is located within the reference plane. The magnetic sensor 1 is disposed to face the end face of the magnet 5.

The configurations of the means for generating the external magnetic field MF and the magnetic sensor 1 are not limited to the example shown in FIG. 1. The means for generating the external magnetic field MF and the magnetic sensor 1 need only be configured so that the relative positional relationship between the means for generating the external magnetic field MF and the magnetic sensor 1 varies so that the direction of the external magnetic field MF in the reference position rotates when viewed from the magnetic sensor 1. For example, the magnet 5 and the magnetic sensor 1 disposed as shown in FIG. 1 may be configured so that: the magnetic sensor 1 rotates while the magnet 5 is fixed; the magnet 5 and the magnetic sensor 1 rotate in opposite directions; or the magnet 5 and the magnetic sensor 1 rotate in the same direction but at mutually different angular velocities.

Alternatively, a magnet that includes one or more pairs of N and S poles arranged alternately in an annular shape may be employed in place of the magnet 5, and the magnetic sensor 1 may be disposed in the vicinity of the outer circumference of the magnet. In this case, at least one of the magnet and the magnetic sensor 1 rotates.

Alternatively, a magnetic scale that includes a plurality of pairs of N and S poles arranged alternately in a straight line may be employed in place of the magnet 5, and the magnetic sensor 1 may be disposed in the vicinity of the periphery of the magnetic scale. In this case, at least one of the magnetic scale and the magnetic sensor 1 moves linearly in the direction in which the N and S poles of the magnetic scale are aligned.

In the above-described various types of configurations of the means for generating the external magnetic field MF and the magnetic sensor 1 also, there exists the reference plane having a predetermined positional relationship with the magnetic sensor 1, and in the reference plane, the direction of the external magnetic field MF rotates about the reference position when viewed from the magnetic sensor 1.

The magnetic sensor 1 includes a first detection circuit 10 and a second detection circuit 20. The first detection circuit 10 generates a first signal having a correspondence relationship with the angle that the direction of the external magnetic field MF in the reference position forms with respect to the reference direction. The second detection circuit 20 generates a second signal having a correspondence relationship with the angle that the direction of the external magnetic field MF in the reference position forms with respect to the reference direction. For ease of understanding, FIG. 1 illustrates the first and second detection circuits 10 and 20 as separate components. However, the first and second detection circuits 10 and 20 may be integrated into a single component. Further, while in FIG. 1 the first and second detection circuits 10 and 20 are stacked in a direction parallel to the center of rotation C, the order of stacking may be reversed from that shown in FIG. 1.

The definitions of directions and angles in this embodiment will now be described with reference to FIG. 2. First, a direction that is parallel to the center of rotation C shown in FIG. 1 and is from one end face of the magnet 5 to the magnetic sensor 1 will be defined as the Z direction. Next, two directions that are orthogonal to each other and perpendicular to the Z direction will be defined as the X direction and the Y direction. In FIG. 2, the X direction is shown as the direction toward the right, and the Y direction is shown as the upward direction. The direction opposite to the X direction will be defined as the −X direction, and the direction opposite to the Y direction will be defined as the −Y direction.

In this embodiment, the reference position PR is the position in which the magnetic sensor 1 detects the external magnetic field MF. The reference direction DR shall be the X direction. The angle that the direction DM of the external magnetic field MF in the reference position PR forms with respect to the reference direction DR will be designated by symbol θ. The direction DM of the external magnetic field MF shall rotate counterclockwise in FIG. 2. The angle θ will be expressed in a positive value when viewed counterclockwise from the reference direction DR, and in a negative value when viewed clockwise from the reference direction DR.

Each of the first and second detection circuits 10 and 20 includes a plurality of magnetoresistive (MR) elements 50, and a plurality of electrodes 40 for electrically connecting the plurality of MR elements 50. The plurality of MR elements 50 and the plurality of electrodes 40 are mounted on the top surface of a substrate that is not illustrated. The planar shape (the shape in a plan view) of each MR element 50 is circular, for example. In FIG. 2, reference numeral 11 indicates the planar shape of any MR element 50 in the first detection circuit 10, while reference numeral 21 indicates the planar shape of any MR element 50 in the second detection circuit 20.

In this embodiment, in particular, each of the first and second detection circuits 10 has a plurality of rows of MR elements. Each of the plurality of rows of MR elements (hereinafter, "MR element rows") includes a plurality of MR elements 50 connected in series. In this embodiment, any two MR elements 50 that are adjacent to each other and connected in series in a row of MR elements (hereinafter, "an MR element row") will be referred to as a first MR element 50A and a second MR element 50B.

FIG. 3 shows the planar shape of the first and second MR elements 50A and 50B. Now, first to third directions relating to the configurations and locations of the first and second MR elements 50A and 50B will be defined as follows. As will be described in detail later, each MR element 50 includes a plurality of layers stacked one on another. First, for the first and second MR elements 50A and 50B, the direction in which the aforementioned plurality of layers are stacked will be defined as the first direction D1. In this embodiment, the first direction D1 is parallel to the Z direction. The first and second MR elements 50A and 50B are aligned in a direction orthogonal to the first direction D1. This direction will be defined as the second direction D2. Then, a direction orthogonal to the first direction D1 and the second direction D2 will be defined as the third direction D3. Each of the first and second MR elements 50A and 50B has two end faces opposite to each other in the first direction D1. Of the two end faces, one closer to the top surface of the substrate will be referred to as the bottom surface, and the other farther from the top surface of the substrate will be referred to as the top surface. Hereinafter, also for any other components having two end faces opposite to each other in the first direction D1, one of the two end faces closer to the top surface of the substrate will be referred to as the bottom surface, and the other farther from the top surface of the substrate will be referred to as the top surface.

The plurality of electrodes 40 include a plurality of first electrodes 40A electrically connecting the respective bottom surfaces of two adjacent MR elements 50 to each other, and a plurality of second electrodes 40B electrically connecting the respective top surfaces of two adjacent MR elements 50 to each other. The first and second MR elements 50A and 50B are classified into two types: ones connected in series by an electrode 40A and the others connected in series by an electrode 40B. Both the first and second electrodes 40A and 40B correspond to the "electrode electrically connecting the first and second magnetoresistive elements to each other" according to the invention.

Here, an end face of the MR element 50A and an end face of the MR element 50B that are electrically connected to each other by the electrode 40A or 40B will be referred to as the first end face of the MR element 50A and the first end face of the MR element 50B, respectively. On the other hand, for each of the MR elements 50A and 50B, the opposite end face to the first end face will be referred to as the second end face. For the MR elements 50A and 50B connected in series by the electrode 40A, their bottom surfaces are the first end faces while their top surfaces are the second end faces. For the MR elements 50A and 50B connected in series by the electrode 40B, their top surfaces are the first end faces while their bottom surfaces are the second end faces.

Each of the electrodes 40A and 40B includes a first portion 41 having a first surface 41a, a second portion 42 having a second surface 42a, and a coupling portion 43 coupling the first portion 41 and the second portion 42 to each other. FIG. 3 shows the planar shapes of the first portion 41, the second portion 42 and the coupling portion 43 of the electrode 40A. In FIG. 3, the boundary between the first portion 41 and the coupling portion 43 and the boundary between the second portion 42 and the coupling portion 43 are shown by dotted lines. In the electrode 40A, at least part of the first surface 41a is in contact with the first end face (the bottom surface) of the first MR element 50A, and at least part of the second surface 42a is in contact with the first end face (the bottom surface) of the second MR element 50B. For the electrode 40A, the first surface 41a is the top surface of the first portion 41, and the second surface 42a is the top surface of the second portion 42.

Although not illustrated, the first portion 41, the second portion 42 and the coupling portion 43 of the electrode 40B are shaped in the same manner as those of the electrode 40A. However, for the electrode 40B, the first surface 41a is the bottom surface of the first portion 41, and the second surface 42a is the bottom surface of the second portion 42. In the electrode 40B, at least part of the first surface 41a is in contact with the first end face (the top surface) of the first MR element 50A, and at least part of the second surface 42a is in contact with the first end face (the top surface) of the second MR element 50B. The descriptions below concerning the first portion 41 (the first surface 41a), the second portion 42 (the second surface 42a) and the coupling portion 43 shall apply to both of the electrode 40A and the electrode 40B unless specifically distinguished.

Each of the first surface 41a and the second surface 42a has a three-fold or higher rotationally symmetric shape. In the example shown in FIG. 3, each of the first surface 41a and the second surface 42a has a four-fold rotationally symmetric shape. In particular, the first and second surfaces 41a and 42a shown in FIG. 3 are in the shape of a square with rounded corners.

Note that an n-fold rotationally symmetric shape (n is any integer equal to or greater than two) is also an m-fold rotationally symmetric shape where in is a divisor of n. For this embodiment, the rotationally symmetric shape of the first and second surfaces 41a and 42a is expressed with the highest one of the orders of rotational symmetry that apply to that shape. A circular shape can be said to be a rotationally symmetric shape in which the maximum value of n is infinite. Thus, a circular shape is included in the three-fold or higher rotationally symmetric shape according to the definition employed for this embodiment.

Each of the first surface 41a and the second surface 42a preferably has a four-fold or higher rotationally symmetric shape, and more preferably a four-fold or higher, even number-fold rotationally symmetric shape. The reason for this will be described in detail later.

Each of the first end face of the first MR element 50A and the first end face of the second MR element 50B has a threehold or higher rotationally symmetric shape. In the example shown in FIG. 3, each of the first and second MR elements 50A and 50B is circular in planar shape, and therefore the first end face of each of the first and second MR elements 50A and 50B also has a circular shape. In each of the first and second MR elements 50A and 50B, the second end face has the same shape as the first end face.

In FIG. 3, symbol 41c indicates the center of the first surface 41a, while symbol 42c indicates the center of the second surface 42a. Further, symbol 50Ac indicates the center of the first end face of the first MR element 50A, while symbol 50Bc indicates the center of the first end face of the second MR element 50B. In this embodiment, as shown in FIG. 3, the center 50Ac and the center 41c substantially coincide with each other, while the center 50Bc and the center 42c substantially coincide with each other. Further, in the example shown in FIG. 3, the first surface 41a is larger than the first end face of the MR element 50A, while the second surface 42a is larger than the first end face of the MR element 50B.

In FIG. 3, symbol 41B indicates a first inscribed circle inscribed in the outer edge of the first surface 41a, while symbol 42B indicates a second inscribed circle inscribed in the outer edge of the second surface 42a. As shown in FIG. 3, the diameter a1 of the first inscribed circle 41B and the diameter a2 of the second inscribed circle 42B are greater than the width W of the coupling portion 43 in the third direction D3. The ratio a1/W of the diameter a1 of the first inscribed circle 41B to the width W of the coupling portion 43 and the ratio a2/W of the diameter a2 of the second inscribed circle 42B to the width W of the coupling portion 43 preferably fall within the range of 1.5 to 10, more preferably within the range of 1.5 to 5. The reason for this will be described in detail later.

Figure 4:
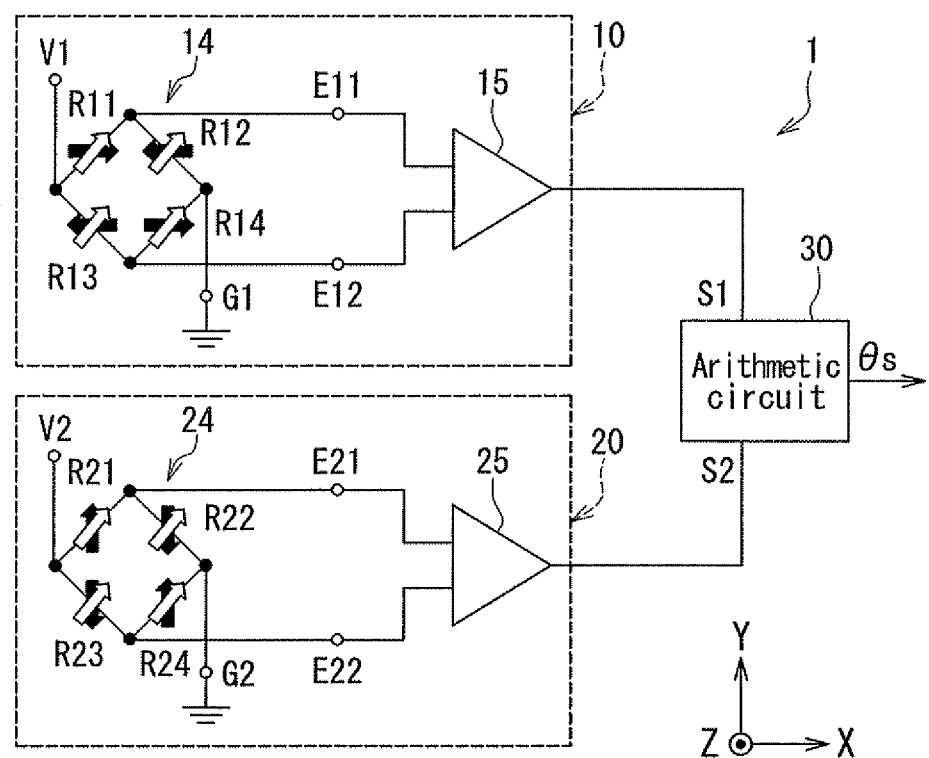
FIG. 4 is a circuit diagram illustrating the configuration of the magnetic sensor according to the embodiment of the invention.

Now, the configuration of the magnetic sensor 1 will be described in detail with reference to FIG. 4. FIG. 4 is a circuit diagram illustrating the configuration of the magnetic sensor 1. The first detection circuit 10 detects an X-direction component of the external magnetic field MF in the reference position PR and generates a first signal S1 associated with the strength of the component. The second detection circuit 20 detects a Y-direction component of the external magnetic field MF in the reference position PR and generates a second signal S2 associated with the strength of the component. Each of the first and second signals S1 and S2 has a correspondence relationship with the angle θ.

The first and second signals S1 and S2 vary periodically with the same signal period T. The second signal S2 differs from the first signal S1 in phase. The second signal S2 preferably differs from the first signal S1 in phase by an odd number of times ¼ the signal period T. However, in consideration of the production accuracy of the MR elements 50 and other factors, the difference in phase between the first signal S1 and the second signal S2 can be slightly different from an odd number of times ¼ the signal period T. In this embodiment, the second signal S2 differs from the first signal S1 in phase by ¼ the signal period T, in particular. The waveforms of the first and second signals S1 and S2 ideally trace a sinusoidal curve (including a sine waveform and a cosine waveform).

The first detection circuit 10 has an output for outputting the first signal S1. The second detection circuit 20 has an output for outputting the second signal S2. The magnetic sensor 1 further includes an arithmetic circuit 30. The arithmetic circuit 30 has two inputs and an output. The two inputs of the arithmetic circuit 30 are connected to the respective outputs of the first and second detection circuits 10 and 20.

The arithmetic circuit 30 computes a detected value θs having a correspondence relationship with the angle θ. In this embodiment, the detected value θs is the value of the angle θ detected by the magnetic sensor 1. The arithmetic circuit 30 can be implemented by a microcomputer, for example. How to compute the detected value θs will be described in detail later.

The first detection circuit 10 has a Wheatstone bridge circuit 14 and a difference circuit 15. The Wheatstone bridge circuit 14 includes a power supply port V1, a ground port G1, two output ports E11 and E12, a first pair of MR element rows R11 and R12 connected in series, and a second pair of MR element rows R13 and R14 connected in series. Each of the MR element rows R11 to R14 includes a plurality of MR elements 50 connected in series. One end of each of the MR element rows R11 and R13 is connected to the power supply port V1. The other end of the MR element row R11 is connected to one end of the MR element row R12 and the output port E11. The other end of the MR element row R13 is connected to one end of the MR element row R14 and the output port E12. The other end of each of the MR element rows R12 and R14 is connected to the ground port G1. A power supply voltage of predetermined magnitude is applied to the power supply port V1. The ground port G1 is grounded. The difference circuit 15 outputs to the arithmetic circuit 30 the first signal S1 which corresponds to the potential difference between the output ports E11 and E12.

The second detection circuit 20 has a circuit configuration similar to that of the first detection circuit 10. More specifically, the second detection circuit 20 has a Wheatstone bridge circuit 24 and a difference circuit 25. The Wheatstone bridge circuit 24 includes a power supply port V2, a ground port G2, two output ports E21 and E22, a first pair of MR element rows R21 and R22 connected in series, and a second pair of MR element rows R23 and R24 connected in series. Each of the MR element rows R21 to R24 includes a plurality of MR elements 50 connected in series. One end of each of the MR element rows R21 and R23 is connected to the power supply port V2. The other end of the MR element row R21 is connected to one end of the MR element row R22 and the output port E21. The other end of the MR element row R23 is connected to one end of the MR element row R24 and the output port E22. The other end of each of the MR element rows R22 and R24 is connected to the ground port G2. A power supply voltage of predetermined magnitude is applied to the power supply port V2. The ground port G2 is grounded. The difference circuit 25 outputs to the arithmetic circuit 30 the second signal S2 which corresponds to the potential difference between the output ports E21 and E22.

All the MR elements 50 included in the Wheatstone bridge circuits (hereinafter referred to as bridge circuits) 14 and 24 each include a first ferromagnetic layer, a nonmagnetic layer, and a second ferromagnetic layer stacked along the first direction D1 between the first end face and the second end face. In this embodiment, the MR elements 50 are spin-valve MR elements, more specifically, TMR elements. GMR elements may be employed instead of the TMR elements. The TMR elements or GMR elements each include a magnetization pinned layer whose magnetization direction is pinned, a free layer whose magnetization direction varies according to the direction DM of the external magnetic field MF, and a nonmagnetic layer disposed between the magnetization pinned layer and the free layer. One of the first and second ferromagnetic layers is the magnetization pinned layer, and the other is the free layer.

For TMR elements, the nonmagnetic layer is a tunnel barrier layer. For GMR elements, the nonmagnetic layer is a nonmagnetic conductive layer. The TMR elements or GMR elements vary in resistance depending on the angle that the magnetization direction of the free layer forms with respect to the magnetization direction of the magnetization pinned layer. The resistance reaches its minimum value when the foregoing angle is 0°. The resistance reaches its maximum value when the foregoing angle is 180°. In FIG. 4, the filled arrows indicate the magnetization directions of the magnetization pinned layers of the MR elements 50, and the hollow arrows indicate the magnetization directions of the free layers of the MR elements 50.

In the first detection circuit 10, the magnetization pinned layers of the plurality of MR elements 50 included in the MR element rows R11 and R14 are magnetized in the X direction, and the magnetization pinned layers of the plurality of MR elements 50 included in the MR element rows R12 and R13 are magnetized in the −X direction. In FIG. 2, the arrow DP1 indicates the magnetization direction of the magnetization pinned layers of the plurality of MR elements 50 included in the MR element rows R11 and R14. In this case, the potential difference between the output ports E11 and E12 varies according to the strength of the X-direction component of the external magnetic field MF. The first detection circuit 10 thus detects the strength of the X-direction component of the external magnetic field MF and generates the first signal S1 indicative of the strength.

In the second detection circuit 20, the magnetization pinned layers of the plurality of MR elements 50 included in the MR element rows R21 and R24 are magnetized in the Y direction, and the magnetization pinned layers of the plurality of MR elements 50 included in the MR element rows R22 and R23 are magnetized in the −Y direction. In FIG. 2, the arrow DP2 indicates the magnetization direction of the magnetization pinned layers of the plurality of MR elements 50 included in the MR element rows R21 and R24. In this case, the potential difference between the output ports E21 and E22 varies according to the strength of the Y-direction component of the external magnetic field MF. The second detection circuit 20 thus detects the strength of the Y-direction component of the external magnetic field MF and generates the second signal S2 indicative of the strength.

In consideration of the production accuracy of the MR elements 50 and other factors, the magnetization pinned layers of the plurality of MR elements 50 in the detection circuits 10 and 20 may be magnetized in directions that are slightly different from the above-described directions.

Figure 5:
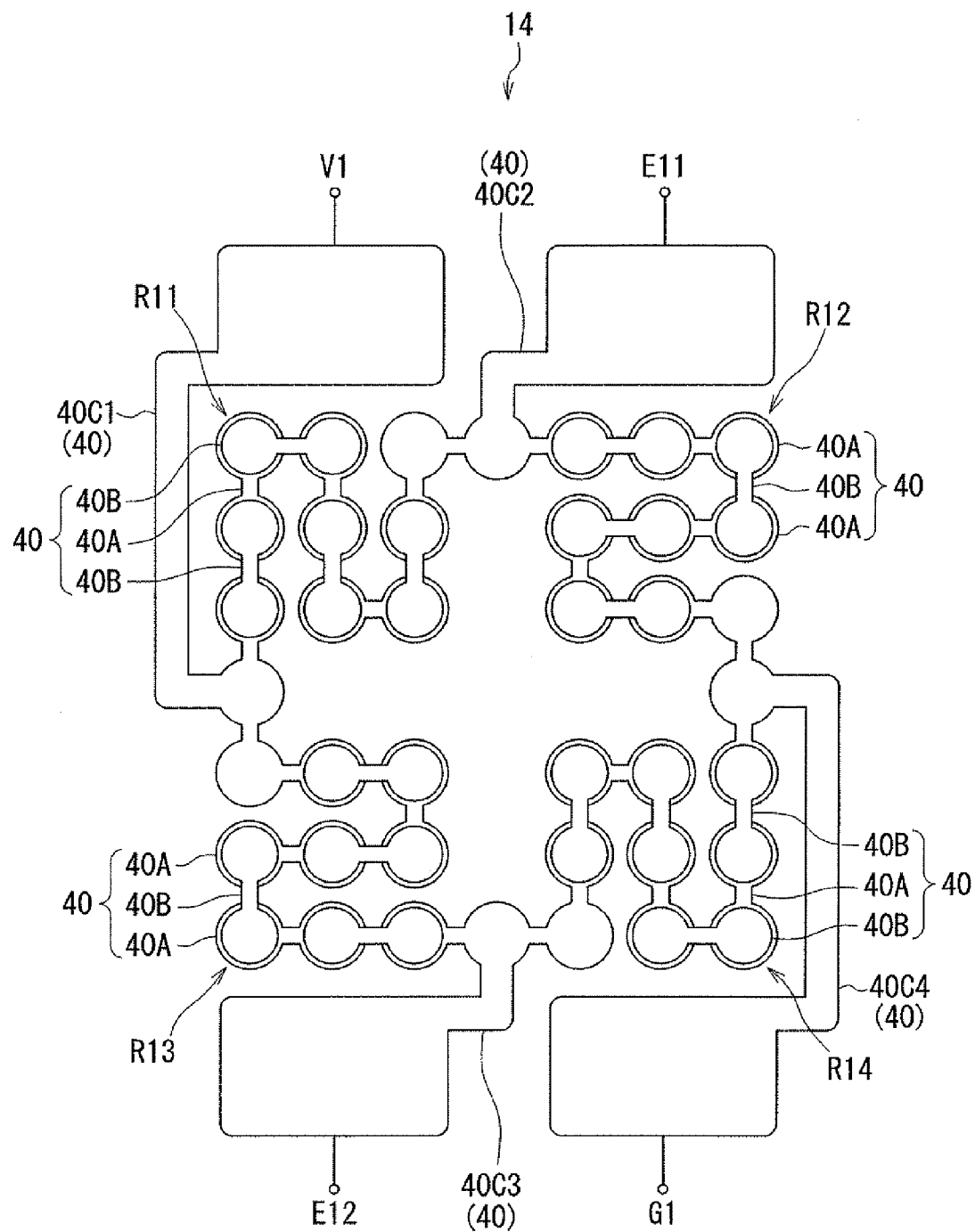
FIG. 5 is a plan view illustrating a Wheatstone bridge circuit shown in FIG. 4.

An example of the configurations of the bridge circuits and the MR element rows will now be described with reference to FIG. 5. FIG. 5 is a plan view illustrating the bridge circuit 14 shown in FIG. 4. In the example shown in FIG. 5, each MR element row is composed of eight MR elements 50 and a plurality of electrodes 40. The plurality of electrodes 40 include a plurality of first electrodes 40A and a plurality of second electrodes 40B.

In each MR element row, the plurality of first electrodes 40A are arranged with spacing between every adjacent ones on a substrate (not illustrated) so as to be in a meandering configuration as a whole. Two adjacent MR elements 50 are disposed on the first portion 41 and the second portion 42 of each of the first electrodes 40A. Thus, a single first electrode 40A connects two adjacent MR elements 50 in series.

Further, in each MR element row, the plurality of second electrodes 40B are arranged with spacing between every adjacent ones on the plurality of MR elements 50 so as to be in a meandering configuration as a whole. The first portion 41 and the second portion 42 of each of the second electrodes 40B are disposed on two adjacent MR elements 50 that are not connected to each other by a single first electrode 40A. Thus, a single second electrode 40B serially connects two adjacent MR elements 50 that are not connected by a single first electrode 40A. In this manner, the plurality of MR elements 50 included in each MR element row are connected in series via the plurality of first electrodes 40A and the plurality of second electrodes 40B.

The plurality of electrodes 40 included in the bridge circuit 14 shown in FIG. 5 further include four third electrodes 40C1, 40C2, 40C3, and 40C4 for electrically connecting two MR element rows. The third electrodes 40C1, 40C2, 40C3, and 40C4 are disposed on the non-illustrated substrate.

The electrode 40C1 electrically connects the MR element 50 located at one end of the MR element row R11 to the MR element 50 located at one end of the MR element row R13, and is electrically connected to the power supply port V1. The electrode 40C2 electrically connects the MR element 50 located at the other end of the MR element row R11 to the MR element 50 located at one end of the MR element row R12, and is electrically connected to the output port E11. The electrode 40C3 electrically connects the MR element 50 located at the other end of the MR element row R13 to the MR element 50 located at one end of the MR element row R14, and is electrically connected to the output port E12. The electrode 40C4 electrically connects the MR element 50 located at the other end of the MR element row R12 to the MR element 50 located at the other end of the MR element row R14, and is electrically connected to the ground port G1.

Part of each of the electrodes 40C1, 40C2, 40C3, and 40C4 in the vicinity of the MR element 50 may have the same shape as the first portion 41 or the second portion 42 of the first electrode 40A. The bridge circuit 24 is configured in the same manner as the bridge circuit 14 shown in FIG. 5.

Figure 6:
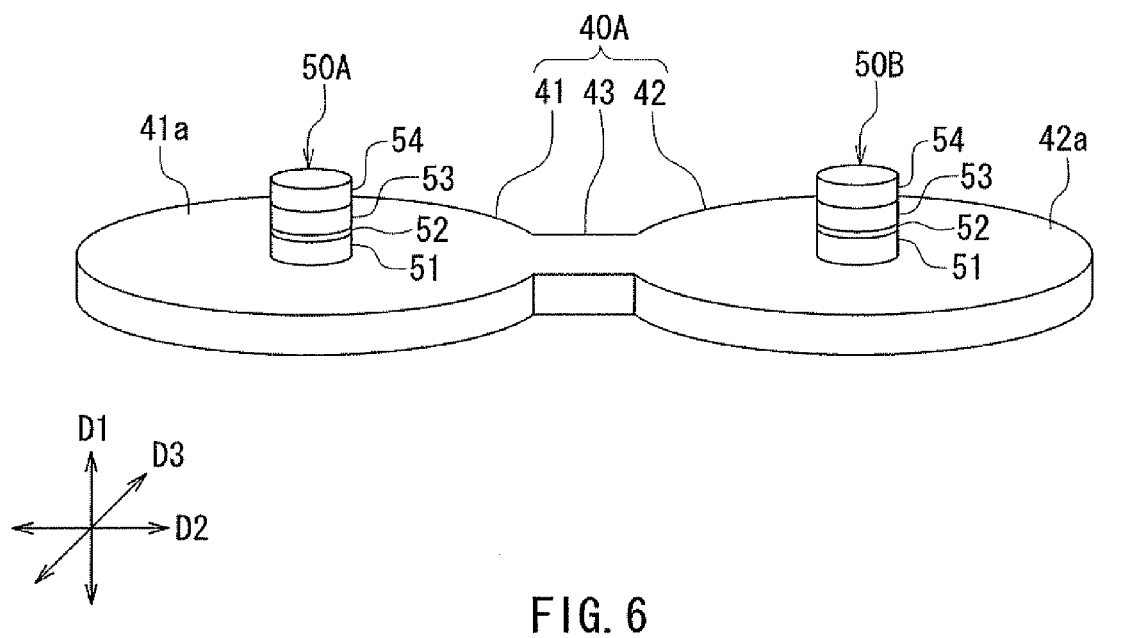
FIG. 6 is a perspective view illustrating a pair of first and second MR elements and a first electrode of the embodiment of the invention.

The configuration of the MR elements 50 will now be described with reference to FIG. 6. FIG. 6 shows a pair of first and second MR elements 50A and 50B, and a first electrode 40A connecting these MR elements in series. In the example shown in FIG. 6, each of the MR elements 50 (50A and 50B) is shaped like a cylinder and has a top surface and a bottom surface. For each of the MR elements 50 (50A and 50B) shown in FIG. 6, the bottom surface is the first end face while the top surface is the second end face. Each of the MR elements 50 (50A and 50B) includes a free layer 51, a nonmagnetic layer 52, a magnetization pinned layer 53, and an antiferromagnetic layer 54 stacked in this order along the first direction D1 between the first end face and the second end face, the free layer 51 being closest to the first electrode 40A. The antiferromagnetic layer 54 is made of an antiferromagnetic material, and is in exchange coupling with the magnetization pinned layer 53 so as to pin the magnetization direction of the magnetization pinned layer 53. The first electrode 40A electrically connects the free layer 51 of the first MR element 50A and the free layer 51 of the second MR element 50B to each other. Although not illustrated, the second electrode 40B electrically connects the antiferromagnetic layers 54 of two adjacent MR elements 50 that are not connected to each other by a single first electrode 40A. Note that the arrangement of the layers 51 to 54 in the MR elements 50 (50A and 50B) may be vertically inverted relative to the arrangement shown in FIG. 6.

How to compute the detected value Os will now be described with reference to FIG. 4. In the example shown in FIG. 4, the magnetization directions of the magnetization pinned layers 53 of the MR elements 50 in the second detection circuit 20 are ideally orthogonal to the magnetization directions of the magnetization pinned layers 53 of the MR elements 50 in the first detection circuit 10. In this case, the first signal S1 ideally has a cosine waveform that depends on the angle θ, and the second signal S2 ideally has a sine waveform that depends on the angle θ. In this case, the second signal S2 differs from the first signal S1 in phase by ¼ the signal period T, i.e., by π/2(90°).

When the angle θ is equal to or greater than 0° and smaller than 90° and when the angle θ is greater than 270° and smaller than or equal to 360°, the first signal S1 takes on a positive value. When the angle θ is greater than 90° and smaller than 270°, the first signal S1 takes on a negative value. Further, when the angle θ is greater than 0° and smaller than 180°, the second signal S2 takes on a positive value. When the angle θ is greater than 180° and smaller than 360°, the second signal S2 takes on a negative value.

Based on the first and second signals S1 and S2, the arithmetic circuit 30 computes the detected value θs having a correspondence relationship with the angle θ. Specifically, the arithmetic circuit 30 computes θs by using the following Equation (1), for example. Note that "a tan" represents an arctangent.

$$\theta s = a\tan(S2/S1) \quad (1)$$

The term "a tan (S2/S1)" of Equation (1) represents the arctangent calculation for determining θs. For θs in the range of 0° or greater and smaller than 360°, there are two solutions of θs in Equation (1) with a difference of 180° in value. Which of the two solutions of θs in Equation (1) is the true solution to θs can be determined from the combination of positive and negative signs on S1 and S2. More specifically, if S1 is positive in value, θs is equal to or greater than 0° and smaller than 90°, or is greater than 270° and smaller than or equal to 360°.

If S1 is negative in value, θs is greater than 90° and smaller than 270°. If S2 is positive in value, θs is greater than 0° and smaller than 180°. If S2 is negative in value, θs is greater than 180° and smaller than 360°. Using Equation (1) and based on the foregoing determination of the combination of positive and negative signs on S1 and S2, the arithmetic circuit 30 determines θs within the range of 0° or greater and smaller than 360°.

A method of forming the plurality of MR elements 50 (MR elements 50A and 50B) and the plurality of electrodes 40 (electrodes 40A, 40B, 40C1, 40C2, 40C3, and 40C4) will now be described with reference to FIG. 7A through FIG. 12B. FIG. 7A to FIG. 12A are plan views each showing a stack of layers formed in the process of forming the plurality of MR elements 50 and the plurality of electrodes 40. FIG. 7B to FIG. 12B show cross sections taken along lines nB-nB (n is any integer from 7 to 12 inclusive) in FIG. 7A to FIG. 12A.

Figures 7A, 7B:
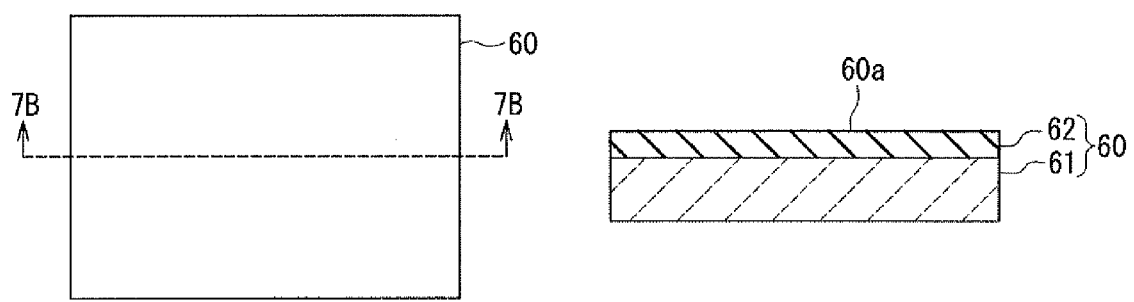
FIG. 7A and FIG. 7B are explanatory diagrams illustrating a step of a method of forming a plurality of MR elements and a plurality of electrodes of the embodiment of the invention.

In the method of forming the plurality of MR elements 50 and the plurality of electrodes 40, a substrate 60 is first prepared as shown in FIG. 7A and FIG. 7B. In the example shown in FIG. 7A and FIG. 7B, the substrate 60 has a substrate body 61 and an insulating layer 62 formed on the top surface of the substrate body 61. The top surface of the insulating layer 62 forms the top surface 60a of the substrate 60. The substrate body 61 may be formed of a semiconductor or an insulating material such as glass, ceramic, resin or the like. The substrate 60 is not limited to one having the substrate body 61 and the insulating layer 62, and may be composed only of an insulating substrate.

Figure 8A:
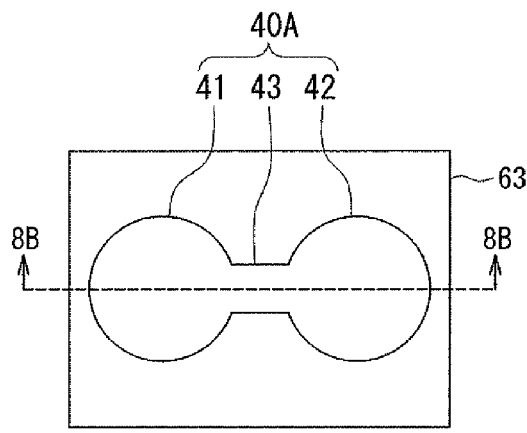
FIG. 8A and FIG. 8B are explanatory diagrams illustrating a step that follows the step of FIG. 7A and FIG. 7B.
Figure 8B:
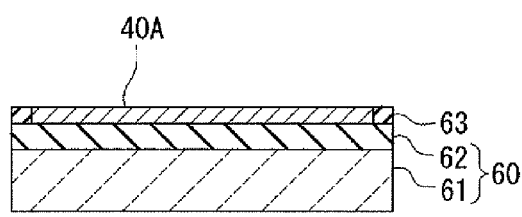

FIG. 8A and FIG. 8B show the next step. In this step, first, the plurality of first electrodes 40A and the third electrodes 40C1, 40C2, 40C3, and 40C4 (not illustrated) are formed on the top surface 60a of the substrate 60. Next, an insulating layer 63 is formed around the electrodes 40A, 40C1, 40C2, 40C3, and 40C4 on the top surface 60a.

Figure 9A:
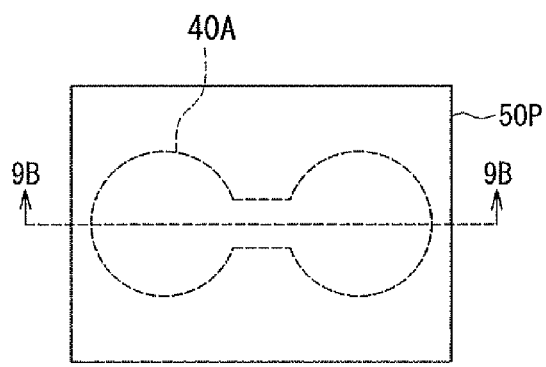
FIG. 9A and FIG. 9B are explanatory diagrams illustrating a step that follows the step of FIG. 8A and FIG. 8B.
Figure 9B:
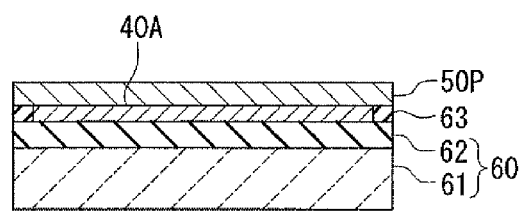

FIG. 9A and FIG. 9B show the next step. In this step, an MR stack 50P is formed over the electrodes 40A, 40C1, 40C2, 40C3 and 40C4 and the insulating layer 63. The MR stack 50P is a multilayer film that is to be patterned later into the plurality of MR elements 50. The MR stack 50P thus includes multiple films that are to be patterned later into a plurality of layers constituting each of the plurality of MR elements 50.

In this embodiment, the plurality of MR elements 50 can be formed into the same configuration except that the magnetization directions of the magnetization pinned layers 53 are different. The magnetization directions of the magnetization pinned layers 53 may be pinned in the step shown in FIG. 9A and FIG. 9B or after the MR stack 50P is patterned.

To pin the magnetization directions of the magnetization pinned layers 53 in the step shown in FIG. 9A and FIG. 9B, for example, separate MR stacks 50P are formed for different magnetization directions of the magnetization pinned layers 53 as described below. First, two MR stacks 50P corresponding to two MR element rows that have the same magnetization direction of the magnetization pinned layers 53 are formed. At this time, the magnetization directions of the films to become the magnetization pinned layers 53 are pinned by forming each of those films in a magnetic field or by subjecting each of those films to heat treatment in a magnetic field. Subsequently, other two MR stacks 50P corresponding to other two MR element rows are formed in the same manner in succession for each different magnetization direction of the magnetization pinned layers 53. In this case, a film whose magnetization direction is to be pinned earlier shall have a higher coercivity than a film whose magnetization direction is to be pinned later. It is thereby possible to pin the magnetization directions of the films to become the magnetization pinned layers 53 in directions varying from one MR element row to another.

In the case of pinning the magnetization directions of the magnetization pinned layers 53 after patterning of the MR stack 50P, a plurality of MR stacks 50P corresponding to all the MR element rows may be formed simultaneously. How to pin the magnetization directions of the magnetization pinned layers 53 in this case will be described later.

Figure 10A:
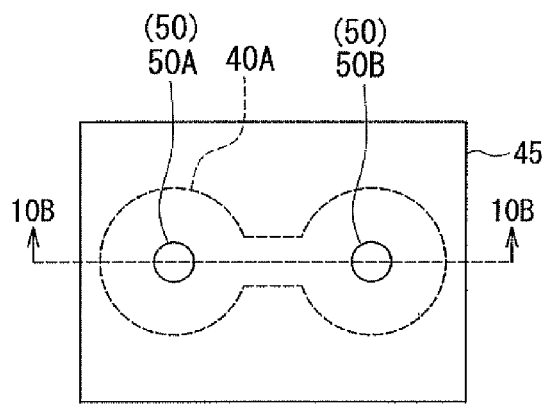
FIG. 10A and FIG. 10B are explanatory diagrams illustrating a step that follows the step of FIG. 9A and FIG. 9B.
Figure 10B:
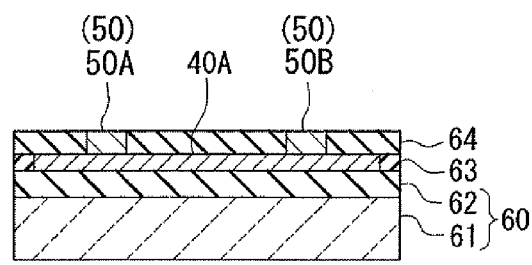

FIG. 10A and FIG. 10B show the next step. In this step, first, the MR stack 50P is etched and thereby patterned into the plurality of MR elements 50 (MR elements 50A and 50B). Next, an insulating layer 64 is formed around the plurality of MR elements 50 on the electrodes 40A, 40C1, 40C2, 40C3 and 40C4 and the insulating layer 63.

A description will now be given of an example of the method of pinning the magnetization directions of the magnetization pinned layers 53 after patterning the MR stack 50P. In this example, as described below, pinning of the magnetization directions of the magnetization pinned layers 53 is performed for each different magnetization direction of the magnetization pinned layers 53 separately. First, while a magnetic field is applied in one direction to a stack including a plurality of MR elements 50, the plurality of MR elements 50 including the magnetization pinned layers 52 whose magnetizations are to be pinned in that direction are locally irradiated with laser light. The temperatures of the magnetization pinned layers 53 of those MR elements 50 are thereby raised and thereafter lowered, so that the magnetizations of the magnetization pinned layers 53 are pinned in that direction. Subsequently, the above-described process is repeatedly performed with the direction of the magnetic field to be applied to the stack varied for each different magnetization direction of the magnetization pinned layers 53.

Figure 11A:
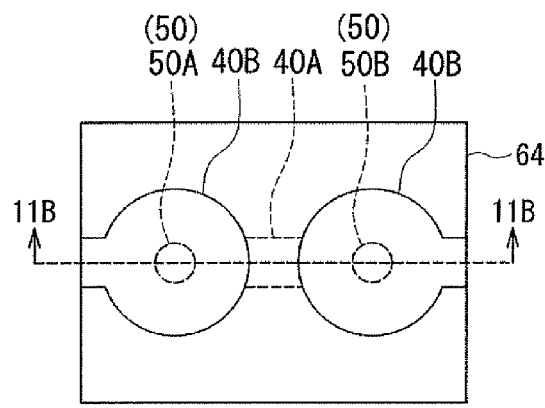
FIG. 11A and FIG. 11B are explanatory diagrams illustrating a step that follows the step of FIG. 10A and FIG. 10B.
Figure 11B:
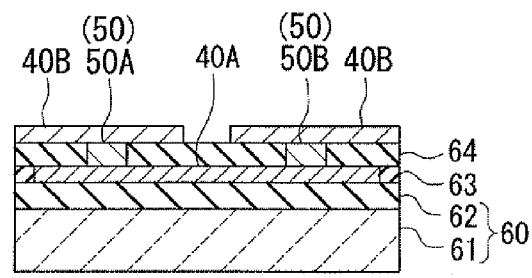
Figure 12A:
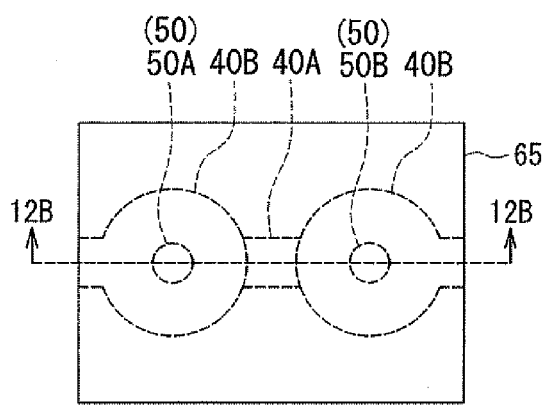
FIG. 12A and FIG. 12B are explanatory diagrams illustrating a step that follows the step of FIG. 11A and FIG. 11B.
Figure 12B:
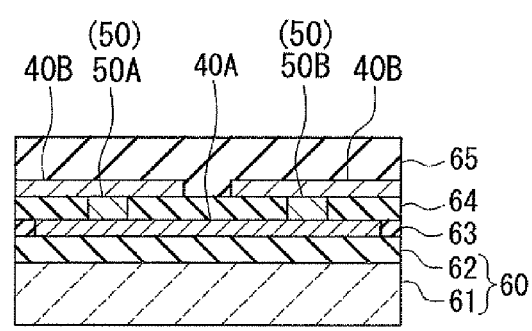

FIG. 11A and FIG. 11B show the next step. In this step, the plurality of second electrodes 40B are formed on the plurality of MR elements 50 and the insulating layer 64. Next, as shown in FIG. 12A and FIG. 12B, a protective film 65 is formed to cover the plurality of second electrodes 40B and the insulating layer 64. The MR elements 50 and the electrodes 40 are completed through a series of steps described above.

The effects of the magnetic sensor 1 according to this embodiment will now be described. The magnetic sensor 1 according to the embodiment includes a plurality of MR elements 50, and a plurality of electrodes 40 for electrically connecting the plurality of MR elements 50 to each other. The plurality of electrodes 40 include a plurality of electrodes 40A and a plurality of electrodes 40B each of which electrically connects two adjacent MR elements 50 to each other. In such a structure, when expansion or contraction of the electrodes 40A and 40B or the material therearound occurs due to, for example, a change in temperature around the magnetic sensor 1, stress will be produced in the electrodes 40A and 40B, and this will in turn induce stress in the MR elements 50 in contact with the electrodes 40A and 40B. Here, if the electrodes 40A and 40B are shaped to be constant in width and elongated in one direction, the stress induced in the MR elements 50 by the electrodes 40A and 40B has anisotropy such that the magnitude of the stress varies according to direction. Such anisotropy will hereinafter be referred to as the anisotropy of stress. In this case, if at least one of the first and second ferromagnetic layers (the free layer 51 and the magnetization pinned layer 53) of the MR elements 50 has a non-zero magnetostriction constant, the ferromagnetic layer (s) having the non-zero magnetostriction constant will have stress magnetic anisotropy. The stress magnetic anisotropy may cause degradation in the detection accuracy of the magnetic sensor 1.

In contrast, the following features of the present embodiment make it possible to alleviate the anisotropy of stress induced in the MR elements 50 by the electrodes 40A and 40B. More specifically, in the embodiment, each of the electrodes 40A and 40B includes the first portion 41 having the first surface 41a, the second portion 42 having the second surface 42a, and the coupling portion 43. Each of the first and second surfaces 41a and 42a has a three-fold or higher rotationally symmetric shape. This feature will be referred to as the first feature. Further, the diameter a1 of the first inscribed circle 41B inscribed in the outer edge of the first surface 41a and the diameter a2 of the second inscribed circle 42B inscribed in the outer edge of the second surface 42a are greater than the width W of the coupling portion 43. This feature will be referred to as the second feature. The first and second features of the embodiment alleviate the anisotropy of stress induced in the MR elements 50 by the electrodes 40A and 40B in contact with the end faces of the MR elements 50. The reason for this will be described in detail below.

Regarding the first feature, "a three-fold or higher rotationally symmetric shape" can be said to be higher in isotropy when compared with a two-fold or lower rotationally symmetric shape. Thus, in this embodiment, the first feature contributes to the alleviation of the anisotropy of stress at the first and second surfaces 41a and 42a. However, if the second feature is not satisfied, i.e., if the diameters a1 and a2 are equal to or smaller than the width W of the coupling portion 43, stress tends to be transferred from one of the first and second portions 41 and 42 to the other. In this case, the anisotropy of stress becomes higher at the first and second surfaces 41a and 42a. In the embodiment, in contrast, the second feature contributes to preventing stress from being transferred from one of the first and second portions 41 and 42 to the other when compared with the case where the diameters a1 and a2 are equal to or smaller than the width W of the coupling portion 43. Thus, according to the embodiment, the first and second features in combination alleviate the anisotropy of stress at the first and second surfaces 41a and 42a. As a result, the anisotropy of stress is also alleviated at the first end faces of the MR elements 50A and 50B in contact with the surfaces 41a and 42a.

Consequently, according to the embodiment, it is possible to alleviate the stress magnetic anisotropy induced by the electrodes 40A and 40B in the first and second ferromagnetic layers (the free layer 51 and the magnetization pinned layer 53) of each of the first and second MR elements 50A and 50B. This makes it possible to prevent degradation in the detection accuracy of the magnetic sensor 1 attributable to the electrodes 40A and 40B.

Further, in the embodiment, the first end face of the first MR element 50A and the first end face of the second MR element 50B each have a three-fold or higher rotationally symmetric shape. The center 50Ac of the first end face of the first MR element 50A and the center 41c of the first surface 41a substantially coincide with each other, while the center 50Bc of the first end face of the second MR element 50B and the center 42c of the second surface 42a substantially coincide with each other. According to the embodiment, these features also contribute to the alleviation of the anisotropy of stress induced in the first and second MR elements 50A and 50B by the electrodes 40A and 40B.

Figure 13A:
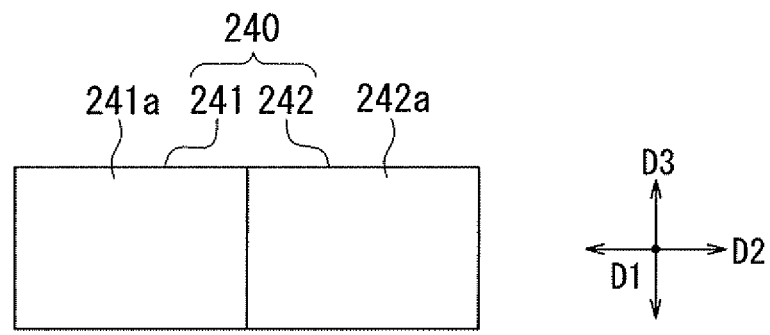
FIG. 13A to FIG. 13F are plan views illustrating electrodes of a plurality of models that were used in a first simulation.
Figure 13B:
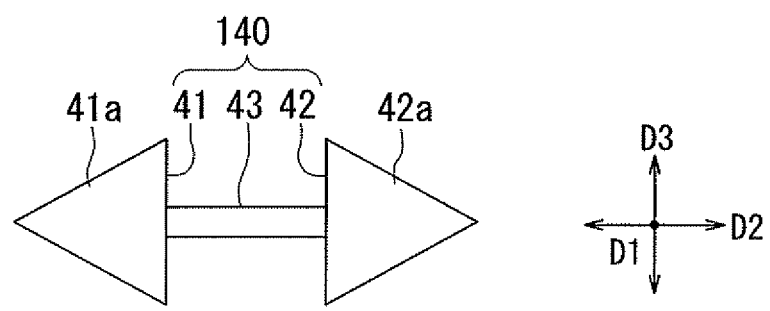
Figure 13C:
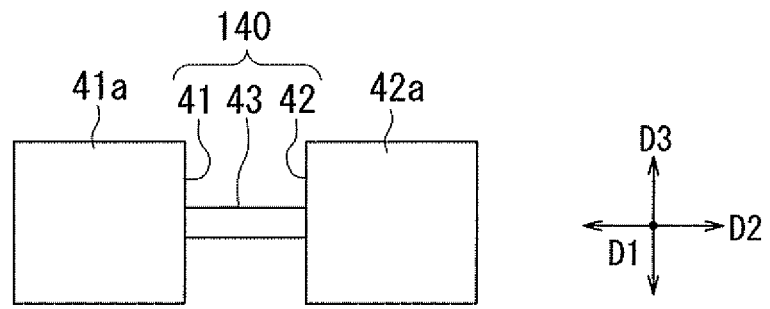
Figure 13D:
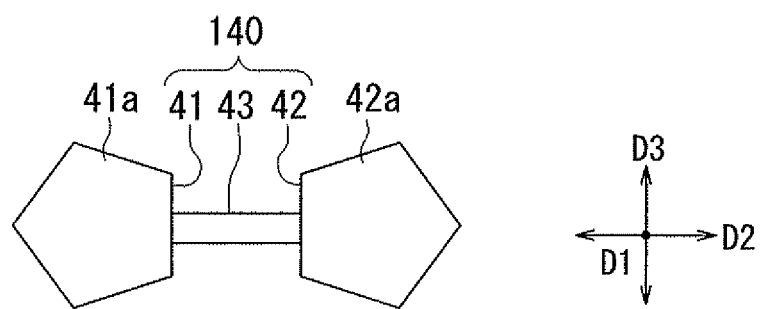
Figure 13E:
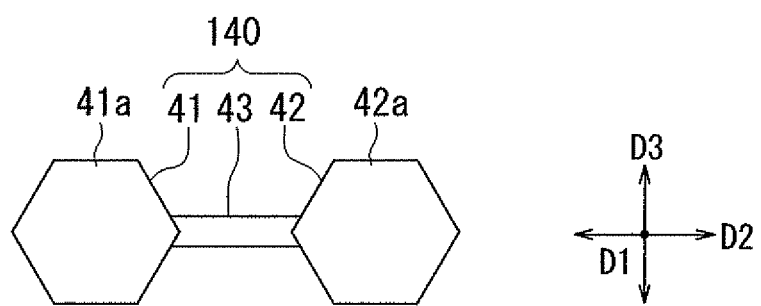
Figure 13F:
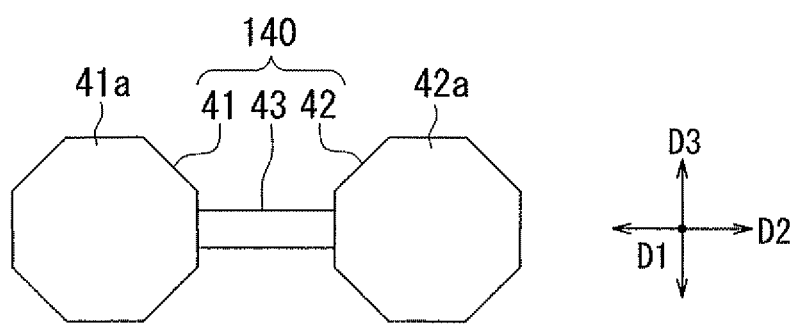

The effects of the embodiment will now be described in more detail with reference to simulation results. A first simulation will be described first. The first simulation was performed to confirm that the first surface 41a and the second surface 42a each having a three-fold or higher rotationally symmetric shape contribute to the alleviation of the anisotropy of stress produced in the first and second MR elements 50A and 50B. Reference is now made to FIG. 13A to FIG. 14B to describe a plurality of models that were used in the first simulation. The plurality of models were a model of a comparative example and models of first to fifth practical examples. FIG. 13A to FIG. 13F are plan views illustrating the electrodes of the plurality of models employed in the first simulation. FIG. 13A shows the electrode of the comparative example, and FIG. 13B to FIG. 13F show the electrodes of the first to fifth practical examples.

The electrode 240 of the comparative example includes a first portion 241 having a first surface 241a, and a second portion 242 having a second surface 242a. Each of the first and second surfaces 241a and 242a has a two-fold rotationally symmetric shape, that is, a rectangular shape. The electrode 240 of the comparative example has no coupling portion, so that the first portion 241 and the second portion 242 are directly coupled to each other. Thus, the electrode 240 of the comparative example is shaped to be constant in width and elongated in one direction.

The electrode 140 of each of the first to fifth practical examples corresponds to the electrodes 40A and 40B of the embodiment. The electrode 140 of each of the first to fifth practical examples includes a first portion 41 having a first surface 41a, a second portion 42 having a second surface 42a, and a coupling portion 43 coupling the first portion 41 and the second portion 42 to each other. Each of the first and second surfaces 41a and 42a of the electrode 140 of the first practical example has a regular triangle shape, i.e., a three-fold rotationally symmetric shape. Each of the first and second surfaces 41a and 42a of the electrode 140 of the second practical example has a square shape, i.e., a four-fold rotationally symmetric shape. Each of the first and second surfaces 41a and 42a of the electrode 140 of the third practical example has a regular pentagon shape, i.e., a five-fold rotationally symmetric shape. Each of the first and second surfaces 41a and 42a of the electrode 140 of the fourth practical example has a regular hexagon shape, i.e., a six-fold rotationally symmetric shape. Each of the first and second surfaces 41a and 42a of the electrode 140 of the fifth practical example has a regular octagon shape, i.e., an eight-fold rotationally symmetric shape.

In the model of the comparative example, two electrodes 240 are connected to the top surface and the bottom surface of a cylinder-shaped MR element 50, respectively. Likewise, in each of the models of the first to fifth practical examples, two electrodes 140 are connected to the top surface and the bottom surface of a cylinder shaped MR element 50, respectively.

Figure 14A:
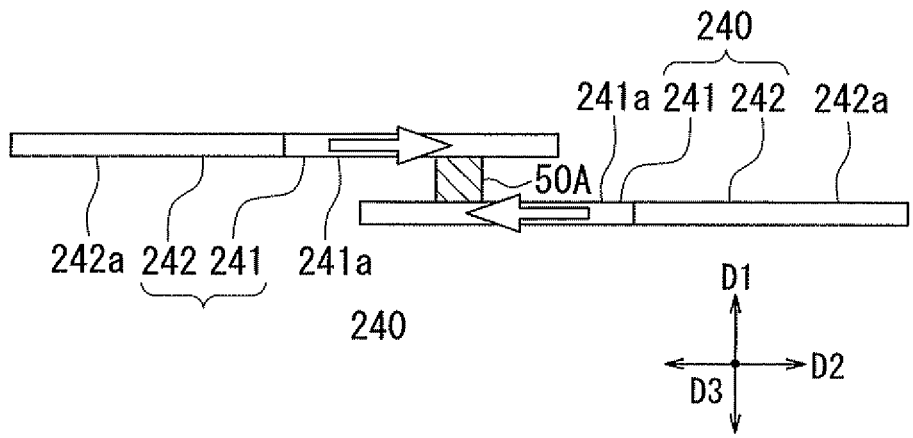
FIG. 14A and FIG. 14B are explanatory diagrams illustrating the principle of occurrence of stress that was assumed for the first simulation.
Figure 14B:
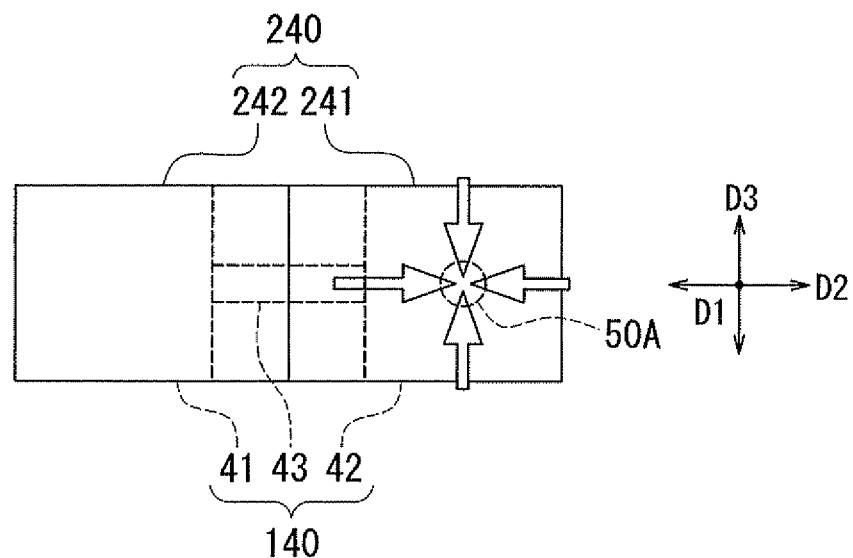

FIG. 14A and FIG. 14B show the model of the comparative example. FIG. 14A is a cross-sectional view showing the MR element 50A and the two electrodes 240. FIG. 14B is a plan view showing the electrode 240 connected to the top surface of the MR element 50A. As shown in FIG. 14A and FIG. 14B, the first surface 241a of the first portion 241 of one of the two electrodes 240 is in contact with the bottom surface of the MR element 50A, while the first surface 241a of the first portion 241 of the other of the two electrodes 240 is in contact with the top surface of the MR element 50A. The center of each of the top and bottom surfaces of the MR element 50A coincides with the center of an inscribed circle inscribed in three of the four sides (the outer edge) of the first surface 241a other than the side that is in contact with the second surface 242a.

In each of the models of the first to fifth practical examples also, the first surface 41a of the first portion 41 of one of the two electrodes 140 is in contact with the bottom surface of the MR element 50A, while the first surface 41a of the first portion 41 of the other of the two electrodes 140 is in contact with the top surface of the MR element 50A. The center of each of the top and bottom surfaces of the MR element 50A coincides with the center 41c (see FIG. 3) of the first inscribed circle 41B inscribed in the outer edge of the first surface 41a. In FIG. 14B, the electrode 140 (the first portion 41, the second portion 42 and the coupling portion 43) of the second practical example is shown by broken lines.

Now, with reference to FIG. 14A and FIG. 14B, a description will be given of the principle of occurrence of stress in the MR element 50A which was assumed for the first simulation. Here, the principle of occurrence of stress will be described using the model of the comparative example shown in FIG. 14A and FIG. 14B; however, the same principle holds for the first to fifth practical examples. As shown in FIG. 14A and FIG. 14B, when the two electrodes 240 (or electrodes 140) are deformed due to expansion or contraction of the two electrodes 240 (or electrodes 140) or the material therearound, there occur external forces causing stress in the MR element 50A. The hollow arrows in FIG. 14A and FIG. 14B indicate the external forces. The first simulation assumed a case where the two electrodes 240 (or electrodes 140) were expanded by heat, and determined the stress ratio. The stress ratio was defined as the ratio $\sigma_2/\sigma_3$ of the stress $\sigma_2$ in the second direction D2 to the stress $\sigma_3$ in the third direction D3, the stresses $\sigma_2$ and $\sigma_3$ being induced in the MR element 50A by the two electrodes 240 (or electrodes 140). The stress ratio represents the anisotropy of stress induced in the MR element 50A by the electrodes 240 (or electrodes 140), and it can be said that the closer the stress ratio is to 1, the lower the anisotropy of stress is.

Figure 15:
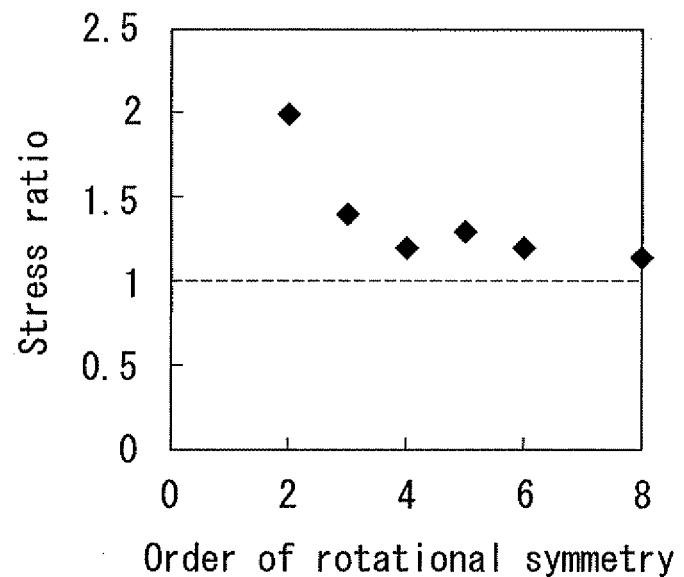
FIG. 15 is a characteristic diagram illustrating the results of the first simulation.

FIG. 15 shows the results of the first simulation. In FIG. 15, the horizontal axis represents the order of rotational symmetry, and the vertical axis represents the stress ratio. The stress ratio for two-hold rotational symmetry is that of the model of the comparative example. The stress ratios for three-fold, four-fold, five-fold, six-fold, and eight-fold rotational symmetries are those of the models of the first to fifth practical examples, respectively. As shown in FIG. 15, when the order of rotational symmetry is three or higher, the stress ratio is closer to 1 than when the order of rotational symmetry is two. This result shows that the first surface 41a having a three-fold or higher rotationally symmetric shape alleviates the anisotropy of stress produced in the MR element 50A better than in the case of a two-fold rotationally symmetric shape.

The above descriptions for the first surface 41a and the first MR element 50A apply also to the second surface 42a and the second MR element 50B. Thus, according to this embodiment, the first surface 41a and the second surface 42a each having a three-fold or higher rotationally symmetric shape contribute to the alleviation of the anisotropy of stress produced in the first and second MR elements 50A and 50B.

Further, as shown in FIG. 15, when the order of rotational symmetry is four or higher, the stress ratio is closer to 1 than when the order of rotational symmetry is three. It is thus preferred that each of the first surface 41a and the second surface 42a have a four-fold or higher rotationally symmetric shape. When the order of rotational symmetry is six or eight, the stress ratio is 1 or higher but not higher than that in the case where the order of rotational symmetry is four. Although not illustrated, when the order of rotational symmetry is an even number equal to or greater than ten, the stress ratio is also 1 or higher but not higher than that in the case where the order of rotational symmetry is four. Thus, it is more preferred that each of the first surface 41a and the second surface 42a have a four-fold or higher, even number-fold rotationally symmetric shape.

A second simulation will now be described. The second simulation was performed to examine the relationship of the ratio a1/W of the diameter a1 of the first inscribed circle 41B to the width W of the coupling portion 43 and the ratio a2/W of the diameter a2 of the second inscribed circle 42B to the width W of the coupling portion 43 with the stress ratio. The second simulation employed the model of the second practical example mentioned in the description of the first simulation. In this model, a1 and a2 are equal, and thus a1/W and a2/W are also equal. In the second simulation, the stress ratio was determined in the same manner as in the first simulation, with the ratio a1/W varied within the range of 1 to 10. Where the ratio a1/W is 1, the diameter a1 of the first inscribed circle 41B and the width W of the coupling portion 43 are equal.

Figure 16:
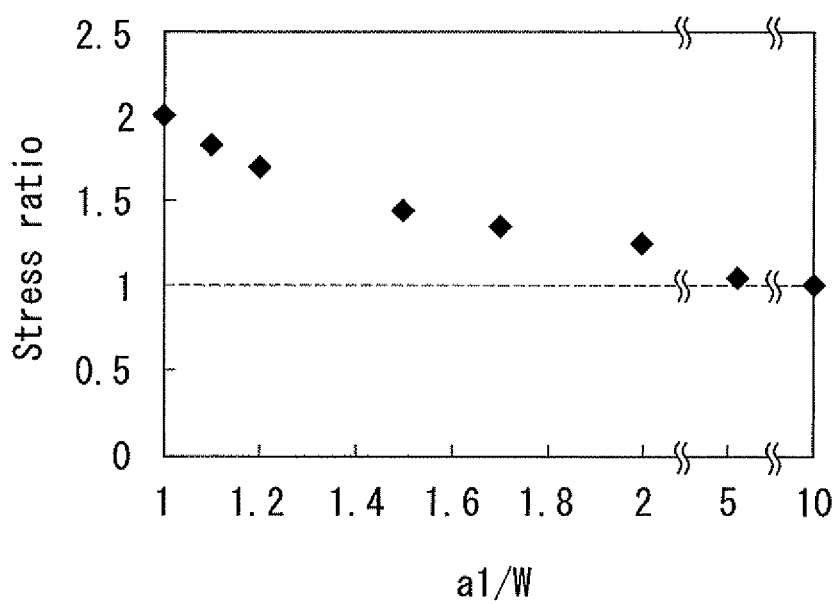
FIG. 16 is a characteristic diagram illustrating the results of a second simulation.

FIG. 16 shows the results of the second simulation. In FIG. 16, the horizontal axis represents the ratio a1/W, and the vertical axis represents the stress ratio. As shown in FIG. 16, as the ratio a1/W increases, the stress ratio becomes closer to 1. This result shows that the anisotropy of stress produced in the MR element 50A can be more alleviated as the ratios a1/W and a2/W increase.

Further, as shown in FIG. 16, the stress ratio is significantly decreased when the ratio a1/W becomes 1.5 or higher. In view of this, it is preferred that the ratios a1/W and a2/W fall within the range of 1.5 to 10.

However, reducing the width W of the coupling portion 43 in order to increase the ratios a1/W and a2/W causes an increase in the resistance of the coupling portion 43, resulting in an increase in the resistance of the MR element row. Thus, the width W of the coupling portion 43 is preferably set within such a range that the resistance of the MR element row does not exceed the allowable upper limit. In general, it is more preferred that the ratios a1/W and a2/W fall within the range of 1.5 to 5 so that the resistance of the coupling portion 43 is not excessively increased.

Figure 17:
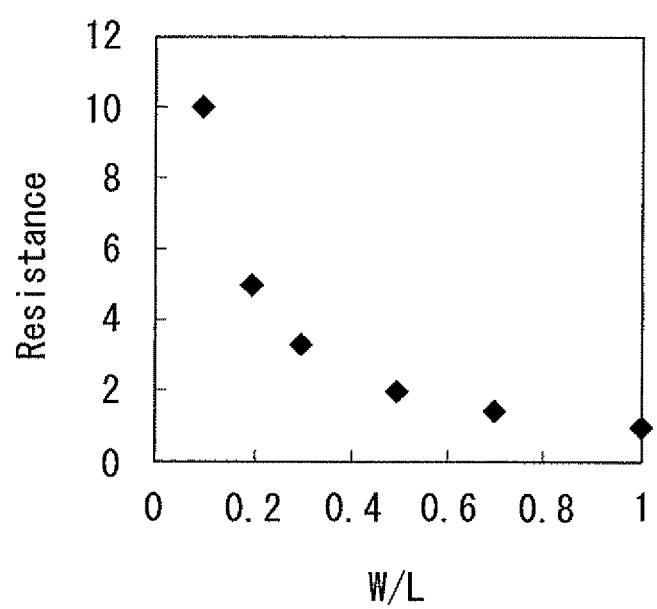
FIG. 17 is a characteristic diagram illustrating the results of a third simulation.

A third simulation will now be described. The third simulation was performed to examine the relationship between the ratio W/L of the width W to the length L of the coupling portion 43 and the resistance of the coupling portion 43. The results of the third simulation are shown in FIG. 17. In FIG. 17, the horizontal axis represents the ratio W/L, and the vertical axis represents the resistance. Note that in FIG. 17, the resistance is expressed in relative values assuming that the resistance is 1 when the ratio W/L is 1. As shown in FIG. 17, the resistance increases as the ratio W/L decreases. The ratio W/L may be preferably decreased in order to increase the ratio a1/W and the ratio a2/W. However, this causes an increase in the resistance of the coupling portion 43. Thus, it is preferred that the ratio W/L be set within such a range that the resistance of the MR element row does not exceed the allowable upper limit.

The present invention is not limited to the foregoing embodiment, and various modifications may be made thereto. For example, the first surface 41a may be of the same size as or smaller than the first end face of the MR element 50A, and the second surface 42a may be of the same size as or smaller than the first end face of the MR element 50B.

It is apparent that the present invention can be carried out in various forms and modifications in the light of the foregoing descriptions. Accordingly, within the scope of the following claims and equivalents thereof, the present invention can be carried out in forms other than the foregoing most preferable embodiment.

What is claimed is:

1. A magnetic sensor comprising:
   a first magnetoresistive element;
   a second magnetoresistive element; and
   an electrode electrically connecting the first and second magnetoresistive elements to each other, wherein
   each of the first and second magnetoresistive elements has a first end face and a second end face opposite to each other in a first direction, and includes a first ferromagnetic layer, a nonmagnetic layer, and a second ferromagnetic layer stacked along the first direction between the first end face and the second end face,
   the first and second magnetoresistive elements are aligned in a second direction orthogonal to the first direction,
   the electrode includes a first portion having a first surface, a second portion having a second surface, and a coupling portion coupling the first and second portions to each other,
   at least part of the first surface is in contact with the first end face of the first magnetoresistive element,
   at least part of the second surface is in contact with the first end face of the second magnetoresistive element,
   each of the first and second surfaces has a three-hold or higher rotationally symmetric shape, and
   each of a first inscribed circle inscribed in an outer edge of the first surface and a second inscribed circle inscribed in an outer edge of the second surface has a diameter greater than a width of the coupling portion in a third direction orthogonal to the first and second directions.

2. The magnetic sensor according to claim 1, wherein one of the first and second ferromagnetic layers is a magnetization pinned layer whose magnetization direction is pinned, and the other is a free layer whose magnetization direction varies according to a direction of an external magnetic field.

3. The magnetic sensor according to claim 1, wherein each of the first end face of the first magnetoresistive element and the first end face of the second magnetoresistive element has a three-hold or higher rotationally symmetric shape.

4. The magnetic sensor according to claim 3, wherein a center of the first end face of the first magnetoresistive element and a center of the first surface coincide with each other, while a center of the first end face of the second magnetoresistive element and a center of the second surface coincide with each other.

5. The magnetic sensor according to claim 1, wherein each of the first surface and the second surface has a four-hold or higher rotationally symmetric shape.

6. The magnetic sensor according to claim 5, wherein each of the first surface and the second surface has a four-hold or higher, even number-hold rotationally symmetric shape.

7. The magnetic sensor according to claim 6, wherein the ratio of the diameter of the first inscribed circle to the width of the coupling portion and the ratio of the diameter of the second inscribed circle to the width of the coupling portion fall within the range of 1.5 to 10.

8. The magnetic sensor according to claim 7, wherein the ratio of the diameter of the first inscribed circle to the width of the coupling portion and the ratio of the diameter of the second inscribed circle to the width of the coupling portion fall within the range of 1.5 to 5.

* * * * *